United States Patent
Gross et al.

(10) Patent No.: US 6,605,691 B1
(45) Date of Patent: Aug. 12, 2003

(54) COMPOSITIONS FOR MAKING ENE-THIOL ELASTOMERS

(75) Inventors: Kathleen B. Gross, Woodbury, MN (US); William J. Schultz, Vadnais Heights, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/252,273

(22) Filed: Sep. 23, 2002

Related U.S. Application Data

(62) Division of application No. 09/567,944, filed on May 10, 2000, now Pat. No. 6,479,622.
(60) Provisional application No. 60/134,012, filed on May 10, 1999.

(51) Int. Cl.[7] .............................................. C08G 75/04
(52) U.S. Cl. ........................ 528/376; 525/204; 525/212
(58) Field of Search ........................ 528/376; 525/204, 525/212

(56) References Cited

U.S. PATENT DOCUMENTS

| | | |
|---|---|---|
| 3,653,959 A | 4/1972 | Kehr et al. |
| 3,809,633 A | 5/1974 | Laurel et al. |
| 3,923,748 A | 12/1975 | Hutt et al. |
| 4,031,271 A | 6/1977 | Bush |
| 4,280,888 A | 7/1981 | Bush et al. |
| 4,366,307 A | 12/1982 | Singh et al. |
| 4,463,169 A | 7/1984 | Irving |
| 4,609,762 A | 9/1986 | Morris et al. |
| 4,808,638 A | 2/1989 | Steinkraus et al. |
| 5,741,884 A | 4/1998 | Cai et al. |
| 5,876,805 A | 3/1999 | Ostlie |
| 5,912,319 A | 6/1999 | Zook et al. |

FOREIGN PATENT DOCUMENTS

| | | |
|---|---|---|
| DE | 2 311 124 | 9/1973 |
| EP | 0 484 054 A1 | 5/1992 |
| EP | 0 598 551 A2 | 5/1994 |
| EP | 0 964 019 A1 | 12/1999 |
| GB | 2 123 431 A | 2/1984 |
| JP | 63-75035 | 5/1988 |
| JP | 63-280739 | 11/1988 |
| JP | 02-032157 | 2/1990 |
| WO | WO 96/14594 | 5/1996 |

*Primary Examiner*—Bernard Lipman
(74) *Attorney, Agent, or Firm*—Scott A. Bardell

(57) ABSTRACT

In one aspect, the invention provides ene-thiol elastomers comprising the reaction product of a polythiol free of hydrophilic groups and having at least two thiol groups and an aromatic, heterocyclic, aliphatic, or cycloaliphatic polyene having at least two reactive unsaturated carbon to carbon bonds. In another aspect, the invention provides ene-thiol elastomer comprising the reaction product of (a) a thiol terminated oligomer comprising the reaction product of a polythiol having two thiol groups and a first polyene or mixture of polyenes having two reactive unsaturated carbon to carbon bonds; and (b) a second polyene or a mixture of polyenes having at least 5 percent functional equivalents of unsaturated carbon to carbon bonds from polyenes having at least three unsaturated carbon to carbon bonds. The ene-thiol elastomers of the invention have a weight increase of not more than 4 weight percent in 15 days at a temperature of 22 ° C. when immersed in a solution of 96 parts by weight water and 4 parts by weight n-butanol and/or a water vapor transmission rate of less than 50 g-mm/m$^2$-day at 40 ° C. according to ASTM D814.

13 Claims, No Drawings

COMPOSITIONS FOR MAKING ENE-THIOL ELASTOMERS

CROSS REFERENCE TO RELATED APPLICATIONS

This application is a divisional of U.S. application Ser. No. 09/567,944, filed May 10, 2000, now U.S. Pat. No. 6,479,622 now allowed, which claims the benefit of U.S. Provisional Application No. 60/134,012, filed May 10, 1999.

FIELD OF THE INVENTION

The invention relates to curable compositions used for making ene-thiol elastomers and cured ene-thiol elastomers made therefrom.

BACKGROUND OF THE INVENTION

Electronic circuits must be protected from exposure to harsh corrosive environments to maintain the performance of the electronic device. Many electronic circuits are used in environments where they are exposed to corrosive liquids. For example, adhesives and encapsulants used to assemble ink jet cartridges must protect the flexible circuit that controls the ink jet head from exposure to corrosive inks. These adhesives and encapsulants experience long term exposure to very corrosive inks. If the adhesive or encapsulant degrade or excessively swell, the ink contacts and corrodes the circuit.

Thermosetting resins, frequently epoxy resins, are used to protect circuits from corrosive environments. Epoxy resins have several characteristics that limit their ability to perform well. Traces of chloride ion, which are frequently present in epoxy resins, promote the corrosion of circuits. Epoxy networks are somewhat hydrophilic and swell in aqueous environments because of the secondary alcohols produced in the curing reaction. Epoxy networks are frequently difficult to fully cure in the time/temperature constraints of electronic manufacturing processes. Unreacted epoxy groups are prone to hydrolysis, forming glycols, which further decreases the water resistance of the network. These epoxy characteristics limit their use as adhesives and encapsulants in corrosive environments.

Many combinations of polyfunctional olefins and mercaptans have been used to prepare ene-thiol networks. While many monomers have very attractive process characteristics (low viscosity and rapid UV curing), they do not provide networks having the requisite environmental resistance to withstand highly corrosive aqueous environments. Polyether dimercaptans are frequently used in ene-thiol compositions. These monomers introduce hydrophilic units to the cured network, resulting in excessive swelling in aqueous environments. Multifunctional mercaptoacetates and propionates are other commonly used thiol monomers. In addition to their hydrophilic character, the ester linkage introduces a site for hydrolysis and network degradation.

SUMMARY OF THE INVENTION

In one aspect, the invention provides a curable composition for making an ene-thiol elastomer comprising a mixture of a polythiol, or a mixture of polythiols, having at least two thiol groups and free of hydrophilic groups, and an aromatic, heterocyclic, aliphatic, or cycloaliphatic polyene having at least two reactive unsaturated carbon to carbon bonds, wherein the composition in cured form, when immersed in a solution of 96 parts by weight water and 4 parts by weight n-butanol, shows a weight increase of not more than 4 weight percent, preferably, not more than 3 weight percent, and more preferably, not more than 2.5 weight percent in 15 days at a temperature of 22° C.

In another aspect, the invention provides a ene-thiol elastomer comprising the reaction product of a composition comprising a mixture of a polythiol having at least two thiol groups and free of hydrophilic groups and an aromatic, heterocyclic, aliphatic, or cycloaliphatic polyene having at least two reactive unsaturated carbon to carbon bonds, wherein the ene-thiol elastomer, when immersed in a solution of 96 parts by weight water and 4 parts by weight butyl alcohol, shows a weight increase of not more than 4 weight percent, preferably, not more than 3 weight percent, and more preferably, not more than 2.5 weight percent in 15 days at a temperature of 22° C.

In another aspect, the invention provides a curable composition for making an ene-thiol elastomer comprising a mixture of (a) a thiol terminated oligomer comprising the reaction product of a polythiol having two thiol groups and a first polyene or mixture of polyenes having two reactive unsaturated carbon to carbon bonds, and (b) a second polyene or a mixture of polyenes having at least 5 percent functional equivalents of unsaturated carbon to carbon bonds from polyenes having at least three unsaturated carbon to carbon bonds, wherein the composition in cured form, when immersed in a solution of 96 parts by weight water and 4 parts by weight n-butanol, shows a weight increase of not more than 4 weight percent, preferably, not more than 3 weight percent, and more preferably, not more than 2.5 weight percent in 15 days at a temperature of 22° C.

Generally, not more than 50 weight percent, preferably, not more than 30 weight percent, more preferably, not more than 20 weight percent, and even more preferably, none of the polythiol used to make the oligomer has hydrophilic groups. The first and second polyenes or mixtures of polyenes may be the same or different. Preferred first polyenes include divinyl ethers, and cyclic polyenes. Preferred polythiols include dimercaptodiethyl sulfide, 1,6-hexanedithiol, and 1,8-dimercapto-3,6-dithiaoctane.

In another aspect, the invention provides a ene-thiol elastomer comprising the reaction product of a composition comprising the reaction product of (a) a thiol terminated oligomer comprising the reaction product of a polythiol having two thiol groups and a first polyene or mixture of polyenes having two reactive unsaturated carbon to carbon bonds and (b) a second polyene or a mixture of polyenes having at least 5 percent functional equivalents of unsaturated carbon to carbon bonds from polyenes having at least three unsaturated carbon to carbon bonds, wherein the composition in cured form, when immersed in a solution of 96 parts by weight water and 4 parts by weight n-butanol, shows a weight increase of not more than 4 weight percent, preferably, not more than 3 weight percent, and more preferably, not more than 2.5 weight percent in 15 days at a temperature of 22° C.

Generally, not more than 50 weight percent, preferably, not more than 30 weight percent, more preferably, not more than 20 weight percent, and even more preferably, none of the polythiol used to make the oligomer has hydrophilic groups. The first and second polyenes or mixtures of polyenes may be the same or different. Preferred first polyenes include divinyl ethers, and cyclic polyenes. Preferred polythiols include dimercaptodiethyl sulfide, 1,6-hexanedithiol, and 1,8-dimercapto-3,6-dithiaoctane.

In another aspect, the invention provides ene-thiol elastomers comprising the reaction product of a composition comprising a mixture of a polythiol having at least two thiol groups and free of hydrophilic groups and an aromatic, heterocyclic, aliphatic, or cycloaliphatic polyene having at least two reactive unsaturated carbon to carbon bonds, wherein the ene-thiol elastomers have a water vapor transmission rate of less than 50, preferably less than 30, more preferably, less than 20 g-mm/m²-day at 40° C. according to ASTM D814.

In another aspect, the invention provides ene-thiol elastomers comprising the reaction product of a composition comprising the reaction product of (a) a thiol terminated oligomer comprising the reaction product of a polythiol having two thiol groups and a first polyene or mixture of polyenes having two reactive unsaturated carbon to carbon bonds and (b) a second polyene or a mixture of polyenes having at least 5 percent functional equivalents of unsaturated carbon to carbon bonds from polyenes having at least three unsaturated carbon to carbon bonds, wherein the ene-thiol elastomers have a water vapor transmission rate of less than 50, preferably less than 30, more preferably, less than 20 g-mm/m²-day at 40° C. according to ASTM D814.

In another aspect, the invention provides an ene-thiol elastomer comprising the reaction product of (a) an unsaturated carbon to carbon bond terminated oligomer comprising the reaction product of a first polythiol having two thiol groups and a polyene or mixture of polyenes having two reactive unsaturated carbon to carbon bonds; and (b) a second polythiol or mixture of polythiols having at least 5 percent functional thiol equivalents from polythiols having at least three thiol groups, wherein the ene-thiol elastomer shows a weight increase of not more than 4 weight percent in 15 days at a temperature of 22° C. when immersed in a solution of 96 parts by weight water and 4 parts by weight n-butanol.

In other aspects, the invention provides a method of making the above ene-thiol elastomers, and an article of manufacture comprising electrical or electronic components encapsulated in a ene-thiol elastomer of the invention.

The compositions of the invention preferably contain a free radical initiator and more preferably, a photoinitiator.

As used herein, the term "polythiols" refers to simple or complex organic compounds which are substantially free of disulfide linkages and have a multiplicity of pendant or terminally positioned —SH functional groups per molecule.

As used herein, the term "free of hydrophilic groups" when used to describe polythiols means polythiols devoid of any ether, ester, hydroxyl, carbonyl, carboxylic acid, sulfonic acid linkages or groups within or pendant from the polythiol molecule.

As used herein, the term "polyene" refers to simple or complex species of alkenes having at least two reactive unsaturated carbon to carbon bonds per molecule.

As used herein, the terms "di functional", "trifunctional", and "tetrafunctional" when used to describe polythiols and polyenes means polythiols having two, three, and four thiol groups and polyenes having two, three, and four reactive unsaturated carbon to carbon bonds.

The compositions of the invention are generally low viscosity liquids that can be uniformly coated onto flexible circuitry and rapidly cured by actinic radiation. The resulting ene-thiol elastomers are tough, flexible, and resist swelling or chemical degradation by water and corrosive components of inks.

One of the unique properties of the ene-thiol elastomers of the invention is the combination of flexibility with resistance to swelling and degradation by water and corrosive environments. Brittle thermoset resins, such as conventional epoxies, may provide reasonable resistance to swelling by corrosive components of inks but are prone to cracking when used on a flexible circuit. The resulting cracks then provide a path for the corrosive liquid to penetrate the coating and corrode the substrate. Low Tg epoxies, acrylates, urethanes or other elastomeric thermosetting resins, which are flexible and resist cracking, are generally prone to degradation by these corrosive liquids. The ene-thiol elastomers of the invention provide the swelling resistance of brittle glassy epoxy resins with elastomeric flexibility.

DETAILED DESCRIPTION OF THE PREFERRED EMBODIMENTS

The polythiols of the invention have at least two thiol groups and are free of hydrophilic groups. Useful polythiols are also substantially free of disulfide linkages that would impart chemical and/or thermal instability to the crosslinked or cured network. The polythiols may be aliphatic or aromatic and may be monomeric or polymeric. Useful polythiols have the formula:

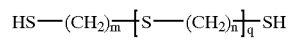

where m=2–12, n=2–12, q=0–4, where m and n can be the same or different; or the formula H—S—R—S—H, where R=$C_5$–$C_8$ cycloaliphatic radical.

The use of di-, tri-, and tetra-functional polythiols is also contemplated in the present invention.

Specific examples of useful polythiols include dimercaptodiethyl sulfide; 1,6-hexanedithiol; 1,8-dimercapto-3,6-dithiaoctane; propane-1,2,3-trithiol; 1,2-bis[(2-mercaptoethyl)thio]-3-mercaptopropane; tetrakis(7-mercapto-2,5-dithiaheptyl)methane; and trithiocyanuric acid. The polythiols may be used alone or in combination with one another.

When using polythiols having two thiol groups, useful polyenes of the invention may be characterized by mixtures of those materials having at least 5 percent functional equivalents of unsaturated carbon to carbon bonds contributed by polyenes having at least three unsaturated carbon to carbon bonds. Preferred polyenes are heterocyclic, aliphatic, or cycloaliphatic diene, allyl ether, allyl ester, vinyl ether, styryl, (meth)acryl, allyl or vinyl compounds having at least two or three reactive unsaturated carbon to carbon bonds per molecule. Mixtures of polyenes, each having two and three unsaturated carbon to carbon bonds respectively, are preferred. Specific examples include triallyl-1,3,5-triazine-2,4, 6-trione; 2,4,6-triallyloxy- 1,3,5-triazine; 1,4-cyclohexanedimethanol divinyl ether; 4-vinyl-1-cyclohexene; 1,5-cyclooctadiene; and diallyl phthalate. Combinations of useful polyenes may also be used in the compositions of the invention. The polythiols and polyenes are present in the compositions and elastomers of the invention in a stoichiometric amount.

The composition of the invention may contain a free radical initiator, preferably a UV active free radical initiator, to cure or crosslink the composition. Useful free radical initiators which are well known in the art and include the class of free radical initiators are commonly referred to as "photoinitiators." A preferred commercially available free radical initiator, also a photoinitiator, is IRGACURE 651, available from Ciba Specialty Chemicals, Tarrytown, N.J. Alternatively, the compositions of the invention may also contain thermally activated free radical initiators.

The compositions of the invention are generally made by mixing a stoichiometric amount of one or more polythiols and one or more polyenes in an appropriate vessel. In the case of reacting polythiols and polyenes, each having two thiol and unsaturated carbon to carbon bonds respectively, it may be preferable to first form an oligomer using a sub-stoichiometric amount of polyene and then reacting the oligomer with a polyene having at least three unsaturated carbon to carbon bonds to form the crosslinked elastomer. If a photoiniator is used, the components may be mixed in the absence of actinic radiation and then stored in the dark for extended periods of time. If desired, the compositions of the invention may contain conventional inhibitors to prevent spontaneous radical polymerization.

One of the advantages of first preparing an oligomer by reacting a sub-stoichiometric amount of polyene having two unsaturated carbon to carbon bonds with polythiol having two thiol groups is that the oligomer, having an increased molecular weight, may be vacuum devolatilized so to substantially reduce the objectionable odor characteristics of polythiols. The resulting oligomers have very low vapor pressures by virtue of their molecular weight and have little odor, but may contain volatile sulfur containing compounds that cause objectionable odor. The removal of such compounds results in compositions having low odor. Another advantage of first preparing oligomers is that such preparation allows the use of combinations of polyenes having different reactivities. For example, a polyene having two unsaturated carbon to carbon bonds having low reactivity can be used to prepare the oligomer and a mixture of polyenes having two and three unsaturated carbon to carbon bonds having relatively high reactivity can be used to react with the oligomer to form the elastomer.

Alternatively, the ene-thiol elastomers of the invention may be made using a polythiol having either three or four thiol groups per molecule and a polyene oligomer terminated with unsaturated carbon to carbon bonds. Such polyene oligomers can be made from the reaction of a polyene having two unsaturated carbon to carbon bonds and a sub-stoichiometric amount of a polythiol having two thiol groups per molecule. Elastomers can be made by reacting the polyene oligomer with polythiols, wherein at least 5 percent of the functional equivalents of thiol is provided by polythiols having at least three thiol groups per molecule.

The compositions can then be applied to the desired substrate, for example, electrical connectors, or other electrical components and the like, and exposed to electron beam radiation. If the composition contains a photoinitiator, the composition may be exposed to any form of actinic radiation, such as visible light or UV radiation, but is preferably exposed to UVA (320 to 390 nm) or UVV (395 to 445 nm) radiation. Generally, the amount of actinic radiation should be sufficient to form a solid mass that is not sticky to the touch. Generally, the amount of energy required curing the compositions of the invention ranges from about 0.4 to 20.0 J/cm$^2$.

Glossary

DMDS—Dimercaptodiethyl sulfide (Structure 1), $HSC_2H_4SC_2H_4SH$, CAS No. 3570-55-6, available from Itochu Specialty Chemical Inc.

DMDO—1,8-dimercapto-3,6-dioxooctane, $HSC_2H_4OC_2H_4OC_2H_4SH$, CAS NO. 14970-87-7, available from Itochu Specialty Chemical Inc.

EBMP—Ethylene bis(3-mercaptopropionate), $HSC_2H_4COOC_2H_4OOCC_2H_4SH$, 7575-23-7, available from Evans Chemetics Division of Hampshire Chemicals.

CAPCURE® 3-800 - Trifunctional mercaptan terminated liquid polymer, available from Henkel Corporation.

HDT—1,6-hexanedithiol, $HSC_6H_{12}SH$, CAS No. 1191-43-1, available from Aldrich Chemical Company.

IGRACURE 651 - 2,2-Dimethoxy-2-phenylacetophenone, $C_6H_5COC(OCH_3)_2C_6H_5$, CAS No. 24650-42-8, available from Ciba Specialty Chemicals.

TAIC—Triallyl-s-triazine-2,4,6(1H,3H,5H)-trione, (Structure 2), CAS No. 1025-15-6, available from Aldrich Chemical Company.

TAC—Triallyloxy-1,3,5-triazine, (Structure 3), CAS No. 101-37-1, available from Aldrich Chemical Company.

Rapi-Cure CHVE - 1,4-cyclohexanedimethanol divinyl ether (Structure 4), CAS No. 17351-75-6, available from International Specialty Products.

VCH—4-vinyl-1-cyclohexene (Structure 5), CAS No. 100-40-3, available from Aldrich Chemical Company.

COD—1,5-cyclooctadiene (Structure 6), CAS No. 111-78-4, available from Aldrich Chemical Company.

DAP—diallyl phthalate (Structure 7), CAS No. 131-17-9, available from Aldrich Chemical Company.

PEGDE—poly(ethylene glycol) divinyl ether (Structure 8), CAS No. 50856-26-3, available from Aldrich Chemical Company.

AIBN—2,2'-azobisisobutronitrile, CAS No. 78-67-1, available from Aldrich Chemical Company. It is used as a thermal free radical initiator.

NPAL—tris(N-nitroso-N-phenylhydroxylamine) aluminum salt, CAS No. 15305-07-4, available from First Chemical Corporation. It is used as a radical inhibitor.

Structure 1
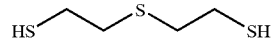

Structure 2
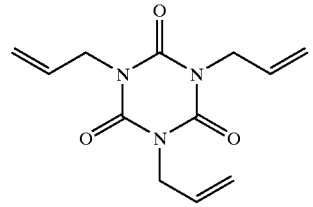

Structure 3
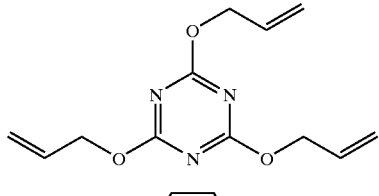

Structure 4
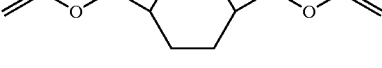

Structure 5
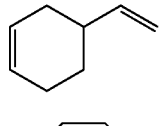

Structure 6

Structure 7

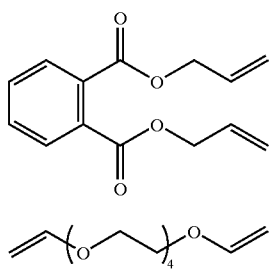

Structure 8

Oligomer Preparation

A variety of oligomers with different backbone structures were synthesized. DMDS was chosen as a monomer to minimize the amount of ether linkages in the backbone and maximize the number of thioether linkages. The oligomers were prepared by the addition of a dimercaptan to a diolefin under free radical conditions. The molecular weight of the oligomer was controlled by reaction stoichiometry. The reactions were carried out either thermally or photochemically. Polymerizations carried out with less reactive olefins such as VCH and COD were more successful using the photochemical method.

Thermal Procedure. A dimercaptan or mixture of dimercaptans was weighed into a flask, AIBN was added, and the flask was heated to 65° C. A diolefin was added dropwise to the dimercaptan solution at a rate to maintain the temperature in the flask between 90–100° C. After the addition, the oligomer was stirred for 4 hours, and the temperature was maintained at 75–80° C. The reaction product was checked by $^1$H NMR and $^{13}$C NMR to determine whether any olefin groups remained. If olefin was still present in the product mixture, additional AIBN was added and the oligomer was stirred at 75–80° C. for an additional 5 hours, when the amount of olefin remaining was determined to be less than 4 percent by $^1$H NMR. The oligomers in Table 1 were prepared using the thermal procedure.

Alternative Thermal Procedure. The reaction was carried out as described above; however, 0.5 percent AIBN was dissolved into the diolefin, and the resulting solution was added to the dimercaptan.

TABLE 1

|  | DMDS | CHVE | DAP | Initiator Wt. % | Reaction Time | Target $M_N$ |
|---|---|---|---|---|---|---|
| Oligomer 1 | 100.3 g | 112.7 | — | 0.3% | 4 hr | 2800 |
| Oligomer 2 | 30.37 g | 25.45 | — | 0.5% | 4 hr | 830 |
| Oligomer 3 | 24.57 g | — | 35.06 g | 0.6% | 9 hr | 2800 |
| Oligomer 4 | 25.20 g | — | 25.24 g | 0.75% | 9 hr | 830 |

Photochemical Procedure. A dimercaptan, a diolefin, and 0.5 weight percent IRGACURE 651 were weighed into a glass jar. The contents of the jar were shaken and were irradiated for 4 hours with two GTE 15 watt Sylvania 350 nm black light bulbs having a power output of 1 mW/cm$^2$. Additional IRGACURE 651 was added, and the oligomer was heated to 80° C. The oligomer was irradiated again for several hours. The reaction was considered complete when greater than 95 percent of the olefin groups had reacted as judged by $^1$H and $^{13}$C NMR. The oligomers in Table 2 were made using the photochemical procedure.

TABLE 2

|  | DMDS | VCH | COD | Total Initiator | Exposure Time | Target $M_N$ |
|---|---|---|---|---|---|---|
| Oligomer 5 | 39.83 g | 25.41 g | — | 1.3% | 16 hr | 2800 |
| Oligomer 6 | 30.02 g | 15.17 g | — | 0.5% | 4 hr | 830 |
| Oligomer 7 | 35.03 g | — | 22.33 g | 1.0% | 12 hr | 2800 |
| Oligomer 8 | 40.25 g | — | 21.53 g | 1.2% | 12 hr | 1000 |

Oligomers 9 and 10 are described in Table 3 and contain a combination of VCH, which contains no oxygen ether linkages, and CHVE, which has reactive vinyl ether groups. DMDS, VCH, and IRGACURE 651 were weighed into a glass jar. The contents were shaken and irradiated for 4 hours with two GTE 15 watt Sylvania 350 nm black light bulbs having a power output of 1 mW/cm$^2$. CHVE and IRGACURE 651 were added to the resulting oligomer, and the solution was irradiated again for 2 hours.

TABLE 3

|  | DMDS | VCH | CHVE | Total Initiator | Target $M_N$ |
|---|---|---|---|---|---|
| Oligomer 9 | 17.12 g | 5.38 g | 9.76 g | 0.5% | 2800 |
| Oligomer 10 | 25.09 g | 6.05 g | 10.98 g | 0.6% | 830 |

Oligomers 11 and 12 are described in Table 4 and were prepared with a mixture of DMDS and DMDO. The alternative thermal procedure listed above was used, and 0.5 percent AIBN was the catalyst level for each reaction. For Oligomer 11, DMDS and DMDO were used in a 70:30 ratio, and for Oligomer 12 DMDS and DMDO were used in a 50:50 ratio. For both oligomers, there are more sulfur atoms than oxygen atoms in the backbone.

TABLE 4

|  | DMDS | DMDO | CHVE | Target $M_N$ |
|---|---|---|---|---|
| Oligomer 11 | 9.00 g | 7.62 g | 17.08 g | 2800 |
| Oligomer 12 | 15.00 g | 17.72 g | 24.61 g | 830 |

Oligomers 13–18 are described in Table 5 and contain more oxygen atoms than sulfur atoms in the backbone and were prepared for purposes of comparison. The alternative thermal procedure listed above was used, and 0.5 percent AIBN was the catalyst level for each reaction.

TABLE 5

|  | DMDS | DMDO | CHVE | PEGDE | Target $M_N$ |
|---|---|---|---|---|---|
| Oligomer 13 | — | 16.00 g | 15.01 g | — | 2800 |
| Oligomer 14 | — | 15.12 g | 10.29 g | — | 830 |
| Oligomer 15 | 16.01 g | — | — | 22.16 g | 2800 |
| Oligomer 16 | 25.50 g | — | — | 25.53 g | 830 |
| Oligomer 17 | 9.68 g | 11.49 g | — | 26.71 g | 2800 |
| Oligomer 18 | 12.51 g | 14.78 g | — | 24.57 g | 830 |

Preparation of DMDT. DMDT, 1,8-dimercapto-3,6-dithiaoctane (Structure 9), was prepared from 3,6-dithia-1,8-octadiol using the method of Cooper et al. with the exception that 38 percent HCl was used in place of 48 percent HBr in the synthesis. Wolf, R. E., Jr.; Hartman, J. R.; Storey, J. M. E.; Foxman, B. M.; Cooper, S. R. J. Am. Chem. Soc. 1987, 109, 4328–4335.

Structure 9

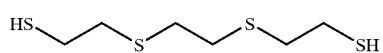

EXAMPLES

Examples 1–4

Examples 1–4 were prepared by mixing the components in the ratios identified in Table 6. The resins were cured by placing 6 grams of the liquid mixture into a 70 mm diameter aluminum dish, heating to 50° C., and irradiating for I hour under two GTE 15 watt Sylvania 350 nm black light bulbs having a power output of I mW/cm$^2$. Clear 1.4 mm thick elastomeric specimens were obtained.

TABLE 6

|  | Example 1 | Example 2 | Example 3 | Example 4 |
|---|---|---|---|---|
| TAIC | 5.0 g | — | 5.0 g | — |
| TAC | — | 5.0 g | — | 5.0 g |
| DMDS | 4.6 g | 4.6 g | — | — |
| HDT | — | — | 4.5 g | 4.5 g |
| IGRACURE 651 | 0.048 g | 0.048 g | 0.048 g | 0.048 g |

Comparative Examples 1–5

Comparative Examples 1–5 were prepared by mixing the components in the ratios identified in Table 7. The resins were cured by placing 6 grams of the liquid mixture into a 70 mm diameter aluminum dish, heating to 50° C., and irradiating for 1 hour under two Sylvania 350 nm black light bulbs having a power output of 1 mW/cm$^2$. Clear 1.4 mm thick elastomeric specimens were obtained.

TABLE 7

|  | Comparative Example 1 | Comparative Example 2 | Comparative Example 3 | Comparative Example 4 | Comparative Example 5 |
|---|---|---|---|---|---|
| TAIC | 5.0 g | 5.0 g | 5.0 g | — | — |
| TAC | — | — | — | 5.0 g | 5.0 g |
| DMDO | 5.46 g | — | — | 5.46 g | — |
| EBMP | — | 7.14 g | — | — | 7.14 g |
| CAP-CURE ® 3-800 | — | — | 16.2 g | — | — |
| IRGACURE 651 | 0.053 g | 0.061 g | — | 0.053 g | 0.061 g |

Absorption Performance at 60° C.

The swelling volume of the cured Examples 1–4 and Comparative Examples 1–5 were measured. Specimens weighing approximately 0.5 grams were cut from the 1.4 mm thick films prepared above, dried for 1 hour in a vacuum oven at a temperature of 100° C. and pressure of 2 torr (266 Pa) and carefully weighed before immersion in distilled water and in a 96/4 mixture, by weight, of water/n-butyl alcohol at 60° C. The samples were removed from the liquids carefully patted dry with a paper towel, and weighed after 24 and 72 hours. The percent weight gain was calculated by the following formula: (swollen weight)-(original weight)/(original weight). The results of this experiment are reported in Table 8.

TABLE 8

|  | % Weight Gain in Water (24 hr) | % Weight Gain in Water (72 hr) | % Weight Gain in Water/n-butanol 96/4 (24 hr) | % Weight Gain in Water/n-butanol 96/4 (72 hr) |
|---|---|---|---|---|
| Example 1 | 1.0% | 1.0% | 1.2% | 1.4% |
| Example 2 | 0.8% | 0.8% | 2.42% | 3.19% |
| Example 3 | 0.6% | 0.6% | 2.1% | 2.7% |
| Example 4 | 0.6% | 0.6% | 3.42% | 4.12% |
| Comparative Example 1 | 2.1% | 2.1% | 6.4% | 6.3% |
| Comparative Example 2 | 2.9% | 3.6% | 6.2% | 7.3% |
| Comparative Example 3 | 8.5% | 8.0% | 22.4% | 18.76% |
| Comparative Example 4 | 1.8% | 1.8% | 7.7% | 7.8% |
| Comparative Example 5 | 2.0% | 2.4% | 8.0% | 7.8% |

The data in Table 8 clearly show that the ene-thiol resins of Examples 1–4 are much more resistant to swelling in water and in water/n-butanol than Comparative Examples 1–5. The water/butanol mixture was used to simulate the swelling characteristics of corrosive inks. The presence of a nonaqueous component such as butanol significantly increases the swelling of the elastomer network as compared to swelling obtained using water alone. Many available inks have significant amounts of water miscible solvents which typically increase swelling of and, in general, facilitates degradation of the elastomer network.

The absorption data in Table 8 also clearly demonstrates the importance of maximizing thioether content and minimizing hydrophilic units in the network. The performance of Examples 1 and 2 when compared to that of Comparative Examples 1 and 4 is particularly surprising. The dimercaptans, DMDO and DMDS, are structurally very similar and the physical properties of the cured networks before exposure to water were very similar. However, the resistance to water and water/n-butanol swell of DMDO and DMDS networks is very different.

Absorption Performance at 22° C.

The swelling of Examples 1–4 and Comparative Examples 1–4, was also measured in a 96/4 mixture of water/n-butanol at room temperature (22° C.) and in Lexmark inks. The cyan ink is from Lexmark's colored ink jet cartridge, part number 12A1980. The composite ink is a mixture of cyan, magenta, and yellow inks from Lexmark's colored ink jet cartridge, part number 12A1980. The black ink is from Lexmark's black ink jet cartridge part number 12A1970. Specimens weighing approximately 0.2 gram were cut from the 1.4 mm thick films prepared above, dried for 24 hours at 60° C. in a vacuum oven, and weighed before immersion in the ink or water/n-butanol solution. The samples swelled in the water/n-butanol mixture or water were immersed at room temperature and removed periodically, carefully dried with a paper towel, and weighed. The samples swelled in the inks were immersed in ink and stored at 60° C. They were periodically removed, and the samples were rinsed with water to remove the ink. They were patted dry with a paper towel and carefully weighed. This is the standard swelling procedure used in all examples and comparative examples. The percentage weight gain was calculated from the formula: (swollen weight)-(original weight)/(original weight). Samples soaked in water/n-butanol or water were soaked for a total of 15 days. After 15 days, the samples were dried in a vacuum oven at 60° C. for 48 to 96 hours to remove the water and n-butanol from the samples. This dried down weight was recorded and used to report a corrected weight gain for the 15 day swelling studies. The corrected percentage weight gain for the 15 day swelling studies was calculated from the following formula: (swollen weight)-(dried down weight)/(dried down weight). This number is reported to correct for any weight losses in the samples due to extraction by the water or water/n-butanol mixture of any uncured material.

The data in Table 9 show the percentage weight increase in water/n-butanol and ink for the examples and comparative examples. The data in Table 9 clearly indicate that Examples 1–4, containing no oxygen ether or ester linkages in the dimercaptan backbone, are much more resistant to swelling in water/n-butanol and ink than the comparative examples, which contain ether or ester linkages in the backbone. Dramatic weight losses over several days in ink were observed for Comparative Examples 2 and 5, which contain easily hydrolyzed ester functional groups.

TABLE 10-continued

| | Oligomer | Oligomer Weight | Crosslinker | Crosslinker Weight |
|---|---|---|---|---|
| Sample 8 | Oligomer 4 | 5.03 g | TAIC | 1.09 g |
| Sample 9 | Oligomer 5 | 16.53 g | TAC | 0.88 g |
| Sample 10 | Oligomer 5 | 13.92 g | TAIC | 0.74 g |
| Sample 11 | Oligomer 6 | 5.15 g | TAC | 1.03 g |
| Sample 12 | Oligomer 6 | 13.09 g | TAIC | 2.61 g |
| Sample 13 | Oligomer 7 | 15.88 g | TAC | 0.98 g |
| Sample 14 | Oligomer 8 | 10.17 g | TAC | 1.51 g |
| Sample 15 | Oligomer 9 | 15.97 g | TAC | 0.91 g |
| Sample 16 | Oligomer 10 | 5.11 g | TAC | 0.98 g |
| Sample 17 | Oligomer 10 | 5.51 g | TAIC | 1.05 g |
| Sample 18 | Oligomer 11 | 16.13 g | TAC | 0.87 g |
| Sample 19 | Oligomer 12 | 4.11 g | TAC | 0.82 g |
| Sample 20 | Oligomer 12 | 4.07 g | TAIC | 0.81 g |

TABLE 9

| | % Weight Gain in Water/n-butanol 96/4 (7 day/15 day corrected[a]) | Composite (5 day/20 day) | Cyan (5 day/20 day) | Black (5 day/20 day) |
|---|---|---|---|---|
| Example 1 | 0.46%/0.60% | 1.26%/2.01% | 1.23%/1.57% | 1.22%/1.34% |
| Example 2 | 0.71%/0.99% | 1.80%/2.07% | 1.77%/1.96% | 1.04%/1.30% |
| Example 3 | 0.64%/0.74% | 1.52%/2.31% | 1.50%/2.10% | 1.04%/1.04% |
| Example 4 | 1.00%/1.35% | 2.25%/2.38% | 1.93%/1.93% | 1.00%/1.00% |
| Comparative Example 1 | 3.76%/4.20% | 4.65%/5.05% | 5.06%/6.35% | 3.56%/3.55% |
| Comparative Example 2 | 5.51%/6.61% | 7.33%/1.17% | 9.86%/10.32% | 7.98%/5.88%[b] |
| Comparative Example 4 | 4.46%/4.86% | 4.94%/5.11% | 5.39%/5.29% | 3.38%/3.14% |
| Comparative Example 5 | 3.63%/4.41% | 6.97%/9.61% | 6.87%/9.19% | 4.93%/0.69% |

[a]The samples were dried for 96 hours to obtain the corrected weight.
[b]These numbers represent 2 and 5 day data because the sample had disintegrated by 20 days.

Example 5

Samples 1–20 are examples of the invention. These samples exemplify that ene-thiol oligomers containing small amounts of oxygen ether linkages and large amounts of thioether linkages can be crosslinked to form solvent, water, and ink resistant elastomeric networks. The samples were prepared by mixing oligomers with either TAIC or TAC as described in the table below. The samples were mixed with 0.5 percent IRGACURE 651 and poured into an aluminum dish or poured into a mold made from two glass plates covered with release liner separated by a 1/16 inch silicone spacer. The samples were irradiated for 1 hour with two GTE 15 watt Sylvania 350 nm black light bulbs having a power output of 1 mW/cm$^2$. The preparation of the samples is described in Table 10.

TABLE 10

| | Oligomer | Oligomer Weight | Crosslinker | Crosslinker Weight |
|---|---|---|---|---|
| Sample 1 | Oligomer 1 | 19.22 g | TAC | 0.97 g |
| Sample 2 | Oligomer 1 | 17.52 g | TAIC | 0.89 g |
| Sample 3 | Oligomer 2 | 5.21 g | TAC | 1.00 g |
| Sample 4 | Oligomer 2 | 12.18 g | TAIC | 2.33 g |
| Sample 5 | Oligomer 3 | 16.30 g | TAC | 0.99 g |
| Sample 6 | Oligomer 3 | 15.04 g | TAIC | 0.94 g |
| Sample 7 | Oligomer 4 | 5.03 g | TAC | 1.08 g |

The ink and moisture resistance for Samples 1–20 is shown in Table 12. The 1/16 inch samples were cut into pieces weighing approximately 0.2 gram, and the standard swelling procedure described above was used. Samples 1–20 swelled less than 4 percent in 96/4 water/n-butanol at room temperature in 15 days. Additionally, most of these samples did not pick up more than 2 percent weight after being immersed in water at 60° C. for 15 days. Also remarkable is that each of these materials swelled less than 4 percent at 60° C. in each of the inks that were tested. These elastomers have low crosslink densities, either 1000 or 3000 molecular weight between crosslinks. This example demonstrates that lightly crosslinked materials in which the number of thioether groups is maximized and the amount of oxygen ether groups is minimized are resistant to swelling by ink, water, and solvent.

Example 6

Sample 21 was prepared to exemplify that a dimercaptan monomer containing four sulfurs in the backbone can be used to prepare ink resistant elastomeric networks. It was prepared by mixing DMDT (2.03 grams), TAIC (1.57 grams), and IRGACURE 819 (0.018 gram) in an aluminum dish on a hot plate. It was passed through a Fusion processor 10 times at 20 ft./min. using the Fusion V Bulb.

Sample 21 was tested in water and water/n-butanol using the standard swelling procedure. The water/n-butanol and water resistance of Sample 21 is shown in Table 12 and is very similar the data obtained for Example 1 which contains DMDS in its backbone. The equilibrium water/n-butanol uptake at room temperature is approximately 0.5 percent, and the equilibrium water uptake at 60° C. is approximately 1 percent. Therefore, DMDT, which contains no oxygen ether or ester linkages, is a dimercaptan monomer that can be used to make resins that are resistant to swelling in ink, water, or solvent.

Example 7

Samples 22 and 23 are described in Table 11 and exemplify another method for synthesizing ink resistant elastomers using ene-thiol chemistry. In these samples, a small amount of difunctional olefin monomer, CHVE, was added to a difunctional mercaptan and TAIC. These three monomers form a low viscosity solution. The molecular weight between crosslinks can be adjusted by the ratio of CHVE and TAIC. For these samples, a dimercaptan monomer, CHVE, TAIC, 500 ppm NPAL, and 0.5 percent IRGACURE 651 were combined and stirred thoroughly. The NPAL was added to prevent premature gelling of the resin. The liquid was poured into a mold made from two glass plates covered with release liners and a 1/16 inch silicone spacer. The samples were irradiated for 1 hour with two GTE 15 watt Sylvania 350 nm black light bulbs having a power output of 1 mW/cm$^2$.

TABLE 11

|  | DMDS | DMDT | CHVE | TAIC |
|---|---|---|---|---|
| Sample 22 | 8.04 g | — | 3.45 g | 5.74 g |
| Sample 23 | — | 9.18 g | 2.84 g | 4.70 g |

Samples 22 and 23 were tested in water/n-butanol and water using the standard swelling procedure. The swelling of Samples 22 and 23 in water/n-butanol and water is reported in Table 12 and is also quite low. The equilibrium water/n-butanol uptake is less than 1.5 percent for both samples, and the equilibrium moisture uptake is approximately 1 percent.

Thus, solvent and moisture resistant resins can be prepared by mixing a dimercaptan with a mixture of difunctional and trifunctional olefins and photochemically curing the resulting solution.

Absorption Performance

Table 12 contains the absorption performance data. The swelling procedures described above were used. The percentage weight gain in ink was calculated from the formula: (swollen weight)-(original weight)/(original weight). The corrected percentage weight gain in water/n-butanol or water was calculated from the following formula: (swollen weight)-(dried down weight)/(dried down weight). To obtain the dried down weight, Samples 1–20 were dried for 48 hours, and Samples 21–23 were dried for 96 hours.

TABLE 12

|  | Water/n-butanol 96/4 (7 day/15 day corrected) | Water (7 day/15 day corrected) | Composite (7 day/15 day) | Cyan (7 day/15 day) | Black (2 day/7 day) |
|---|---|---|---|---|---|
| Sample 1 | 2.30%/2.08% | 0.90%/1.31% | 2.52%/2.45% | 2.45%/2.38% | 0.89%/0.71% |
| Sample 2 | 2.29%/2.07% | 0.89%/1.10% | 2.26%/2.31% | 2.41%/2.58% | 0.73%/0.58% |
| Sample 3 | 2.01%/2.35% | 0.63%/1.09% | 2.43%/2.17% | 2.22%/2.53% | 0.39%/−.13% |
| Sample 4 | 1.65%/2.26% | 0.42%/1.06% | 2.10%/2.10% | 2.28%/2.55% | 0.54%/0.54% |
| Sample 5 | 1.15%/1.87% | 0.85%/1.37% | 2.81%/2.87% | 2.47%/2.41% | 0.45%/0.57% |
| Sample 6 | 1.51%/1.93% | 0.80%/1.43% | 2.62%/2.70% | 2.50%/2.43% | 0.60%/0.40% |
| Sample 7 | 1.28%/1.73% | 0.82%/1.28% | 2.27%/2.40% | 2.45%/2.67% | 0.60%/0.12% |
| Sample 8 | 0.99%/1.37% | 0.79%/1.13% | 2.26%/2.42% | 2.36%/2.52% | 0.51%/0.00% |
| Sample 9 | 0.88%/1.17% | 1.20%/2.80% | 1.97%/1.97% | 2.29%/2.40% | 0.30% |
| Sample 10 | 0.71%/1.18% | 0.52%/0.59% | 1.54%/1.39% | 1.62%/1.68% | 0.42% |
| Sample 11 | 0.58%/0.95% | 0.30%/0.73% | 1.16%/1.10% | 1.55%/1.69% | 0.48%/0.20% |
| Sample 12 | 0.34%/0.43% | 0.14%/0.48% | 1.13%/0.92% | 1.47%/1.55% | 0.43%/0.43% |
| Sample 13 | 0.57%/0.91% | 0.17%/1.38% | 0.84%/1.25% | 0.85%/0.92% | −0.24%/−0.30% |
| Sample 14 | 0.45%/0.68% | 0.11%/1.05% | 1.09%/1.03% | 0.94%/1.00% | 0.32%/0.00% |
| Sample 15 | 0.76%/1.40% | 1.21%/2.94% | 1.99%/1.81% | 2.20%/2.08% | 0.28%/0.14% |
| Sample 16 | 1.28%/2.14% | 0.43%/0.86% | 1.27%/1.27% | 1.53%/1.70% | 0.42%/0.50% |
| Sample 17 | 0.99%/1.28% | 0.41%/0.99% | 1.43%/1.24% | 1.83%/1.90% | 0.54%/0.67% |
| Sample 18 | 3.70%/3.77% | 0.86%/1.19% | 3.56%/3.25% | 3.29%/3.45% | 0.71%/0.65% |
| Sample 19 | 3.52%/3.84% | 0.60%/1.04% | 3.14%/3.45% | 3.48%/3.48% | 1.08%/0.67% |
| Sample 20 | 3.29%/3.60% | 1.03%/1.41% | 3.07%/3.36% | 3.35%/3.46% | 0.91%/0.45% |
| Sample 21 | 0.49%/0.55% | 1.01%/1.24% |  |  |  |
| Sample 22 | 0.91%/1.18% | 0.85%/1.11% |  |  |  |
| Sample 23 | 1.20%/1.45% | 0.76%/0.84% |  |  |  |

Comparative Example 6

This comparative example demonstrates that ene-thiol networks containing significant amounts of oxygen ether linkages have poorer resistance to ink, solvent, and water than Samples 1–20. Comparative Samples CS 1–CS 10 were made by reaction of Oligomers 13 - 18 with either TAIC or TAC as shown in Table 13. The sample preparation procedure was described in Example 6. The solvent, water, and ink resistance of the comparative samples are shown in Table 11. For each of these samples, the swelling in water/n-butanol and inks is higher than that shown in Table 13. The swelling of samples containing large amounts of oxygen ether linkages is as high as 20 percent in water/n-butanol and 17 percent in ink.

TABLE 13

|  | Oligomer | Oligomer Weight | Crosslinker | Crosslinker Weight |
|---|---|---|---|---|
| CS 1 | Oligomer 13 | 11.19 g | TAC | 0.60 g |
| CS 2 | Oligomer 14 | 4.10 g | TAC | 0.77 g |

TABLE 13-continued

|  | Oligomer | Oligomer Weight | Crosslinker | Crosslinker Weight |
|---|---|---|---|---|
| CS 3 | Oligomer 14 | 12.28 g | TAIC | 2.30 g |
| CS 4 | Oligomer 15 | 14.93 g | TAC | 0.92 g |
| CS 5 | Oligomer 16 | 4.06 g | TAC | 0.80 g |
| CS 6 | Oligomer 16 | 4.29 g | TAIC | 0.87 g |
| CS 7 | Oligomer 17 | 17.38 g | TAC | 1.07 g |
| CS 8 | Oligomer 17 | 14.44 g | TAIC | 0.90 g |
| CS 9 | Oligomer 18 | 4.05 g | TAC | 0.76 g |
| CS 10 | Oligomer 18 | 4.22 g | TAIC | 0.81 g |

Comparative Sample CS 11 demonstrates that an elastomer made from a DMDO, a difunctional olefin, and a trifunctional olefin has poorer solvent and moisture resistance than samples made from dimercaptans containing no oxygen ether linkages. Comparative Sample CS 11 was prepared as described for Samples 22 and 23. DMDO (9.03 grams), CHVE (3.28 grams), and TAIC (5.46 grams) were stirred together 500 ppm NPAL and 0.5 percent IRGACURE 651. The liquid was poured into a 1/16 inch glass mold and cured. The water/n-butanol and water uptake for this comparative sample, shown in Table 14, is much higher than was found for Samples 22 and 23, which were made from DMDS and DMDT.

Comparative Absorption Data

For the comparative absorption performance data, shown in Table 14, the standard swelling procedure was used. The percentage weight gain for the inks was calculated from the formula: (swollen weight)-(original weight)/(original weight). The corrected percentage weight gain in water/n-butanol or water was calculated from the following formula: (swollen weight)-(dried down weight)/(dried down weight). To obtain the dried down weight, Comparative Samples CS 1–CS 10 were dried for 48 hours, and Comparative Sample CS 11 was dried for 96 hours.

TABLE 14

|  | Water/n-butanol 96/4(7 day/15 day corrected) | Water (7 day/15 day corrected) | Composite (7 day/15 day) | Cyan (7 day/15 day) | Black (2 day/7 day) |
|---|---|---|---|---|---|
| CS 1 | 6.12%/6.25% | 1.33%/1.80% | 5.40%/5.29% | 5.58%/5.37% | 1.06%/0.57% |
| CS 2 | 5.22%/5.22% | 1.47%/1.96% | 4.79%/4.85% | 5.31%/5.47% | 1.61%/1.54% |
| CS 3 | 5.05%/5.39% | 1.40%/1.88% | 5.02%/5.02% | 5.52%/5.59% | 1.98%/1.67% |
| CS 4 | 11.70%/12.68% | 3.75%/5.00% | 10.43%/10.71% | 10.76%/10.70% | 5.10%/5.31% |
| CS 5 | 6.83%/6.04% | 2.82%/3.60% | 6.17%/6.17% | 7.37%/7.14% | 2.94%/2.76% |
| CS 6 | 7.12%/7.68% | 3.04%/4.20% | 6.70%/6.59% | 7.37%/7.62% | 3.56%/3.56% |
| CS 7 | 18.02%/18.58% | 5.83%/7.10% | 15.55%/15.49% | 16.24%/16.02% | 9.34%/9.09% |
| CS 8 | 17.98%/19.62% | 5.50%/7.13% | 15.67%/15.33% | 16.30%/16.30% | 9.37%/9.37% |
| CS 9 | 10.56%/11.46% | 3.91%/5.11% | 10.10%/9.97% | 10.88%/11.87% | 6.69%/5.47% |
| CS 10 | 11.08%/11.37% | 4.07%/5.26% | 10.84%/10.84% | 11.03%/11.84% | 5.76%/5.26% |
| CS 11 | 4.68%/5.15% | 1.94%/2.22% |  |  |  |

Example 8

Example 8 is a comparison of selected samples having different amounts of sulfur and oxygen present in the network. Example 8 features the water/n-butanol, water, and cyan ink swelling of selected samples prepared from oligomers having a theoretical molecular weight of 2800. The molecular weight between crosslinks for these samples is approximately 3000. The swelling data for the selected samples is summarized in Table 15. Also included in Table 15 is the sulfur weight percent and oxygen weight percent in the oligomer that was used to prepare in the selected samples. This example demonstrates that as the weight percent of sulfur in the oligomer backbone increases and the weight percent of oxygen in the oligomer decreases, the swelling performance of the network improves.

TABLE 15

|  | S weight % | O weight % | 96/4 water/n-butanol swell (7 day/15 day corrected) | Water swell (7 day/15 day corrected) | Cyan swell (7 day/15 day) |
|---|---|---|---|---|---|
| CS 1 | 18 | 17 | 6.12%/6.25% | 1.33%/1.80% | 5.58%/5.37% |
| Sample 18 | 26 | 11 | 3.70%/3.77% | 0.86%/1.19% | 3.29%/3.45% |
| Sample 1 | 29 | 8.7 | 2.30%/2.08% | 0.90%/1.31% | 2.45%/2.38% |
| Sample 15 | 33 | 5 | 0.76%/1.40% | 1.21%/2.94% | 2.20%/2.08% |
| Sample 9 | 38 |  | 0.88%/1.17% | 1.20%/2.80% | 2.29%/2.40% |

Example 9

Example 9 is a comparison of selected samples having different amounts of sulfur and oxygen present in the network. Example 9 features the water/n-butanol, water, and cyan ink swelling of selected samples prepared from oligomers having a theoretical molecular weight of 830. The molecular weight between crosslinks for these samples is approximately 1000. The swelling data for the selected samples is summarized in Table 16. Also included in Table 16 is the sulfur weight percent and oxygen weight percent in the oligomer that was used to prepare in the selected samples. This example demonstrates that as the weight percent of sulfur in the oligomer backbone increases and the weight percent of oxygen in the oligomer decreases, the swelling performance of the network improves.

The specimens were carefully removed from the liners and placed onto fluoroelastomeric gaskets with an outside diameter (O.D.) of 75 mm, an inside diameter (I.D.) of 63.5 mm, and a thickness of 1.5 mm. The gasket and specimen were then placed onto the flanged rim of an aluminum permeation cup containing 100 mL of deionized water. The cup has a volume of 250 mL. A second gasket, 3 mm thick, was placed over the first gasket and the specimen, and a 75 mm diameter piece of window screen was then placed on top of all three. This screen served to prevent stretching of extensible materials.

The gaskets, specimen, and screen were held in place by a circular aluminum ring with an I.D. of 63.5 mm and an O.D. of 88 mm. Along the outer edge of this ring were six

TABLE 16

| | S Weight % | O Weight % | 96/4 water/butanol (3 day/7 day) | Water (3 day/7 day) | Cyan (2 day/7 day) |
|---|---|---|---|---|---|
| CS 2 | 21 | 17 | 5.22%/5.22% | 1.47%/1.96% | 5.31%/5.47% |
| Sample 19 | 28 | 13 | 3.52%/3.84% | 0.60%/1.04% | 3.48%/3.48% |
| Sample 3 | 33 | 7.4 | 2.01%/2.35% | 0.63%/1.09% | 2.22%/2.53% |
| Sample 16 | 36 | 4.2 | 1.28%/2.14% | 0.43%/0.86% | 1.53%/1.70% |
| Sample 11 | 41 | | 0.58%/0.95% | 0.30%/0.73% | 1.55%/1.69% |

Example 10

Example 10 demonstrates the low moisture permeability of thioether containing networks when compared to similar networks containing oxygen ether linkages. In each sample, a difunctional mercaptan was mixed with either TAIC or TAC, 0.5 percent photoinitiator, and in some cases 500 ppm NPAL. The samples were mixed thoroughly at approximately 50° C. and then degassed in a vacuum oven. Each sample was sandwiched between two glass plates that had been coated with Teflon tape. The plates were separated by spacers that were approximately 4 mils thick. The samples were then passed through a Fusion processor at 25 ft/min, five times on each side. Samples containing IRGACURE 651 as the photoinitiator were cured with the Fusion D bulb, and samples containing IRGACURE 819 as the photoinitiator were cured with the Fusion V bulb. Samples 24–32 were prepared in this way and are presented in Table 17.

The permeability test was based on ASTM D814. A "standard" circular die 75 mm in diameter was used to punch press specimens from film samples ranging from 80 to 150 microns thick. Release liners were used on both sides of the specimen to make it easier to handle and measure. This "sandwich" was measured in 10 locations, and the average net film thickness was recorded.

evenly distributed threaded holes, through which screws pass into the flanged rim of the cup. The screws were loosely put in place and the entire assembly placed into a 40° C. oven. After allowing the assembly to equilibrate for 1 hour, the screws were securely tightened, the cup was removed from the oven, and the initial weight was taken. Weights were taken every day or so for the first week, about every third day the second week, and about every fifth day thereafter.

The permeability (g-mm/m$^2$-day@40° C.), or moisture vapor transmission rate, was calculated by multiplying the film thickness (mm) by the total water weight loss (gram), and dividing by the area of the film (0.003167 m$^2$) and the number hours divided by 24 (day). The permeabilities of Samples 24–32 are shown in Table 17.

TABLE 17

| | Dimercaptan | Weight | TAIC (g) | TAC (g) | Initiator | NPAL | Permeability |
|---|---|---|---|---|---|---|---|
| Sample 24 | DMDS | 5.54 g | 5.96 g | — | 819 | Yes | 9 |
| Sample 25 | DMDS | 14.07 g | — | 15.16 g | 651 | Yes | 17 |
| Sample 26 | Oligomer 1 | 8.48 g | 0.43 g | — | 651 | No | 48 |
| Sample 27 | Oligomer 2 | 12.18 g | 2.33 g | — | 651 | No | 35 |
| Sample 28 | Oligomer 4 | 7.96 g | — | 1.71 g | 651 | No | 29 |
| Sample 29 | Oligomer 4 | 6.86 g | 1.49 g | — | 651 | No | 24 |
| Sample 30 | Oligomer 6 | 13.09 g | 2.61 g | — | 651 | No | 18 |
| Sample 31 | Oligomer 9 | 7.25 g | 0.42 g | — | 651 | No | 35 |
| Sample 32 | Oligomer 10 | 5.09 g | 0.98 g | — | 651 | No | 24 |

Comparative Example 7

This comparative example demonstrates the higher moisture permeability of samples containing significant amounts of oxygen ether linkages when compared to Samples 24–32. Comparative Samples CS 12–CS 15 were prepared and measured as described in Example 10 and are summarized in Table 18.

TABLE 18

|  | Dimercaptan | Weight | TAIC | TAC | NPAL | Initiator | Permeability |
|---|---|---|---|---|---|---|---|
| CS 12 | DMDO | 5.11 g | 4.67 g | — | yes | 651 | 55 |
| CS 13 | DMDO | 5.36 g | — | 4.88 g | yes | 819 | 52 |
| CS 14 | EBMP | 6.63 g | 4.61 g | — | yes | 651 | 59 |
| CS 15 | Oligomer 14 | 12.28 g | 2.30 g | — | no | 651 | 99 |

Example 11

Example 11 is a comparison of samples containing different weight percentages of sulfur and oxygen in the network but containing the same molecular weight between crosslinks. Each sample was prepared from an oligomer with a theoretical molecular weight of 830 and TAIC as the crosslinker. For each sample, the molecular weight between crosslinks is approximately 1000. This is important because the crosslink density of the sample greatly affects the permeability of the sample. The weight percentages of sulfur and oxygen in the oligomers used to prepare the samples as well as the moisture permeability are reported in Table 19. The data in Table 19 indicate that the permeability of samples containing the same crosslink density varies significantly with the weight percentages of sulfur and oxygen in the backbone. As the weight percentage of sulfur increase and the weight percentage of oxygen decreases, the permeability of the sample decreases. This example demonstrates that the moisture permeability of ene-thiol networks can be lowered by maximizing the amount of thioether linkages and minimizing the amount of oxygen ether linkages in the backbone.

TABLE 19

|  | S Weight % | O Weight % | Permeability |
|---|---|---|---|
| CS 15 | 21 | 17 | 99 |
| Sample 27 | 33 | 7.4 | 35 |
| Sample 32 | 36 | 4.2 | 24 |
| Sample 30 | 41 | 0 | 18 |

Example 12

Example 12 demonstrates that the odor of thioether oligomers can be decreased by the removal of volatile components. An oligomer of DMDS and CHVE having a molecular weight of 1700 was prepared by the thermal procedure. This oligomer (320 grams) was heated to 80° C. and was dropped into a UIC rolled film evaporator. The jacket temperature of the column was 100° C., and apparatus was under a vacuum of 0.009 mm Hg. Two cold traps, a cold finger with a temperature of 20° C., and a liquid nitrogen trap to protect the vacuum pump, were used. The rollers were set at a speed of 300 rpm. Following this treatment of the oligomer, 2.0 gram of material were collected in the cold finger, and 3.3 grams of material were collected in the liquid nitrogen trap. The material stripped from the oligomer was analyzed and found to contain mostly residual monomer and cyclic impurities from the monomer. The odor of the oligomer was significantly reduced. A second treatment of 225 grams of the oligomer was carried out with a column temperature of 150° C. An additional 0.22 grams of material was collected, and the odor of the oligomer was reduced further.

Other embodiments are within the following claims. While the invention has been described with reference to the particular embodiments and drawings set forth above, the spirit of the invention is not so limited and is defined by the appended claims.

What is claimed is:

1. An article of manufacture comprising electric or electronic components encapsulated in an ene-thiol elastomer comprising the reaction product of:
   (a) a thiol terminated oligomer comprising the reaction product of a polythiol having two thiol groups and a first polyene or mixture of polyenes having two reactive unsaturated carbon to carbon bonds wherein not more than 50 weight percent of the polythiol contains hydrophilic groups and wherein the first polyene comprises allyl, styryl, cycloalkenyl, 1,4-cyclohexanedimethanol divinyl ether, or (meth)acryl compounds or combinations thereof; and
   (b) a second polyene or a mixture of polyenes, having at least 5 percent functional equivalents of unsaturated carbon to carbon bonds from polyenes having at least three unsaturated carbon to carbon bonds,
wherein the composition in cured form, when immersed in a solution of 96 parts by weight water and 4 parts by weight n-butanol, shows a weight increase of not more than 4 weight percent in 15 days at a temperature of 22° C.

2. An article of manufacture comprising electric or electronic components encapsulated in an ene-thiol elastomer comprising the reaction product of:
   (a) a polythiol free of hydrophilic groups and having at least two thiol groups; and
   (b) an aromatic, heterocyclic, aliphatic, or cycloaliphatic polyene having at least two reactive unsaturated carbon to carbon bonds,
wherein the composition in cured form, when immersed in a solution of 96 parts by weight water and 4 parts by weight n-butanol, shows a weight increase of not more than 4 weight percent in 15 days at a temperature of 22° C.

3. The composition of claim 2 wherein said polyene comprises allyl, vinyl, allyl ether, allyl ester, vinyl ether, styryl, cycloalkenyl, or (meth)acryl compounds, or combinations thereof.

4. The composition of claim 2 wherein the polyene is triallyl- 1,3,5-triazine-2,4,6-trione; 2,4,6-triallyloxy- 1,3,5-triazine; 1,4-cyclohexanedimethanol divinyl ether; 4-vinyl-1-cyclohexene; 1,5-cyclooctadiene; diallyl phthalate; or a combination thereof.

5. The composition of claim 2 wherein the polyene is a mixture of a polyene having two reactive unsaturated carbon to carbon bonds and a polyene having three reactive unsaturated carbon to carbon bonds.

6. The composition of claim 2 wherein the heterocyclic polyene is triallyl-1,3,5-triazine-2,4,6-trione; 2,4,6-triallyloxy-1,3,5-triazine; or a combination thereof.

7. The composition of claim 2 wherein the polythiol has the formula:

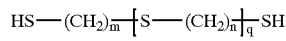

where m=2–12, n=2–12, q=0–4, where m and n can be the same or different; or the formula H—S—R—S—H, where R=$C_5$–$C_8$ cycloaliphatic radical.

8. The composition of claim 2 wherein the polythiol is dimercaptodiethyl sulfide; 1,6-hexanedithiol; 1,8-dimercapto-3,6-dithiaoctane; or a combination thereof.

9. The composition of claim 1 wherein the first polyene is 4-vinyl-1-cyclohexene; 1,5-cyclooctadiene; diallyl phthalate; or a combination thereof.

10. The composition of claim I wherein the polythiol has the formula:

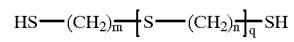

where m=2–12, n=2–12, q=0–4, where m and n can be the same or different; or the formula H—S—R—S—H, where R=$C_5$–$C_8$ cycloaliphatic radical.

11. The composition of claim 1 wherein the polythiol is dimercaptodiethyl sulfide; 1,6-hexanedithiol; 1,8-dimercapto-3,6-dithiaoctane; or a combination thereof.

12. The composition of claim 1 further comprising a free radical initiator.

13. The composition of claim 12 wherein the free radical initiator is UV radiation active or thermally active.

* * * * *

UNITED STATES PATENT AND TRADEMARK OFFICE
CERTIFICATE OF CORRECTION

PATENT NO. : 6,605,691 B1
DATED : August 12, 2003
INVENTOR(S) : Gross, Kathleen B.

It is certified that error appears in the above-identified patent and that said Letters Patent is hereby corrected as shown below:

Column 6,
Line 8, delete "SH" and insert in place thereof -- 5H --.

Column 8,
Line 64, delete "HC1" and insert in place thereof -- HCl --.

Column 9,
Line 14, delete "l hour" and insert in place thereof -- 1 hour --.
Line 16, delete "l mW/cm$^2$" and insert in place thereof -- 1 mW/cm$^2$ --.

Column 13,
Line 67, delete "l percent" and insert in place thereof -- 1 percent --.

Column 21,
Line 21, delete "claim l" and insert in place thereof -- claim 1 --.

Signed and Sealed this

Twenty-second Day of March, 2005

JON W. DUDAS
*Director of the United States Patent and Trademark Office*